United States Patent
Zhang et al.

(10) Patent No.: US 7,671,778 B2
(45) Date of Patent: Mar. 2, 2010

(54) DIGITAL SIGNAL PROCESSING SCHEME FOR HIGH PERFORMANCE HFC DIGITAL RETURN PATH SYSTEM WITH BANDWIDTH CONSERVATION

(75) Inventors: Mao Zhu Zhang, King of Prussia, PA (US); Robert L. Howald, Warrington, PA (US)

(73) Assignee: General Instrument Corporation, Horsham, PA (US)

( * ) Notice: Subject to any disclaimer, the term of this patent is extended or adjusted under 35 U.S.C. 154(b) by 2022 days.

(21) Appl. No.: 10/465,326

(22) Filed: Jun. 18, 2003

(65) Prior Publication Data

US 2004/0261120 A1      Dec. 23, 2004

(51) Int. Cl.
    *H03M 1/58* (2006.01)
(52) U.S. Cl. .................................. 341/170; 725/129
(58) Field of Classification Search ............. 341/50–70; 725/129

See application file for complete search history.

(56) References Cited

U.S. PATENT DOCUMENTS

| 4,682,152 A | * | 7/1987 | Okamoto et al. ............... 341/95 |
| 4,740,993 A | * | 4/1988 | Skubnik ...................... 375/249 |
| 6,323,793 B1 | * | 11/2001 | Howald et al. .............. 341/137 |
| 6,728,182 B2 | * | 4/2004 | Kadlec et al. ............ 369/53.23 |
| 6,809,995 B2 | * | 10/2004 | Kadlec et al. ............ 369/44.29 |
| 6,847,597 B2 | * | 1/2005 | Kadlec et al. ............ 369/44.32 |

* cited by examiner

*Primary Examiner*—Lam T Mai
(74) *Attorney, Agent, or Firm*—Larry T. Cullen

(57) ABSTRACT

In a cable return path system, a method for performing digital companding adds a predetermined offset to the digital value to be companded, and employs a modified µ-law or a-law companding technique to obtain a reduced bit length digital value. One embodiment of this modified approach adds a predetermined offset (e.g., 129 for a 12-bit implementation) to the digital value before companding and then employs a two-bit chord and a 5-bit step for the 12-bit implementation. The end result is that the performance metrics are not significantly compromised by this bit reduction when compared to current transmission methods without this technique.

18 Claims, 7 Drawing Sheets

Figure 1 – Basic HFC Digital Return Path System

Figure 2 – Non-Uniform Quantization – Standard u-law and Modified u-law Quantization Steps Figure 3 – Standard and Modified u-law Compression Characteristic Figure 4 – Reduced Bandwidth Noise Power Ratio Performance Figure 5 – Reduced Bandwidth Performance

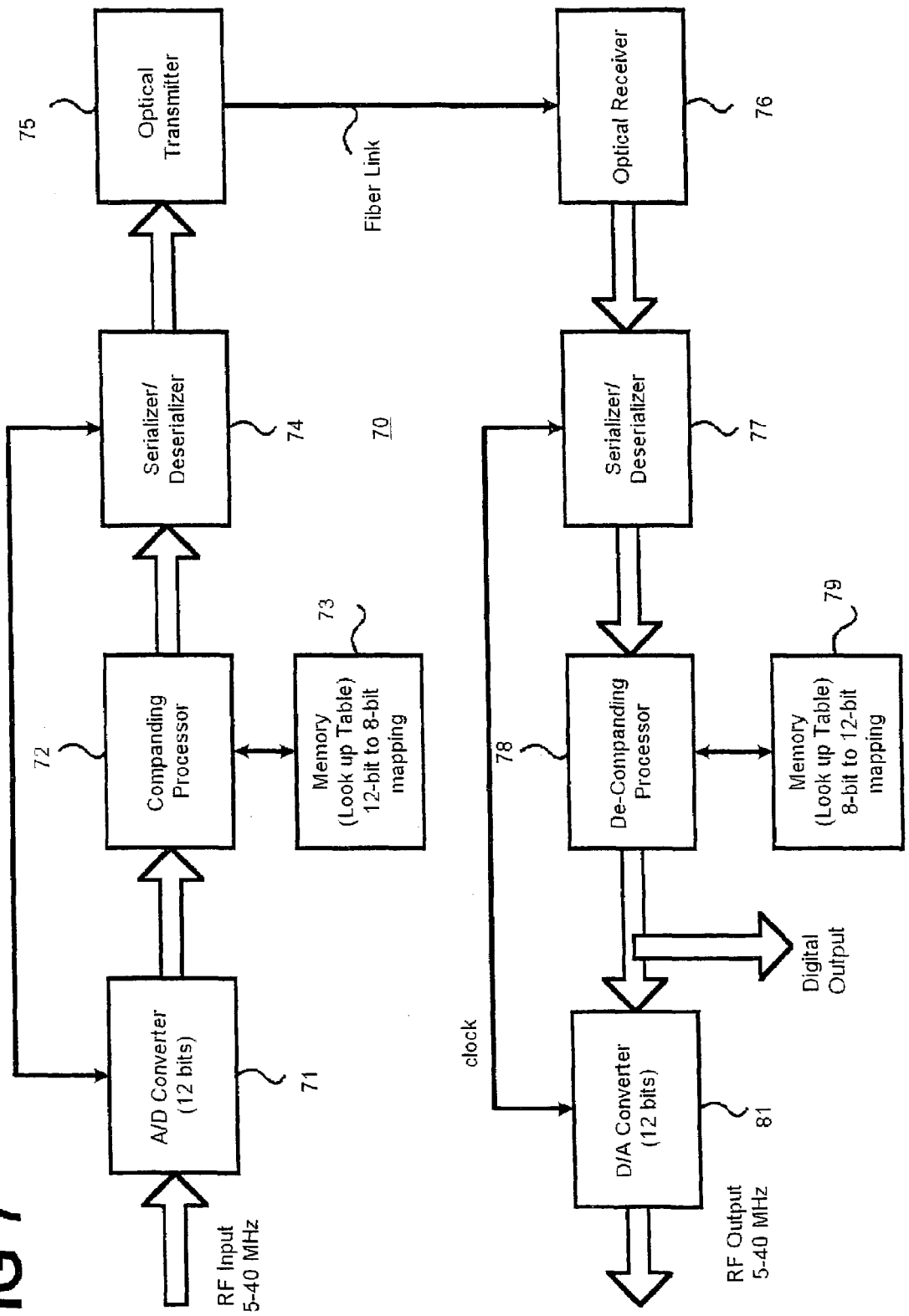

DIGITAL SIGNAL PROCESSING SCHEME FOR HIGH PERFORMANCE HFC DIGITAL RETURN PATH SYSTEM WITH BANDWIDTH CONSERVATION

FIELD OF THE INVENTION

The present invention is directed to methods and apparatuses for communicating over a cable network, and more particularly to a method and apparatus for communicating over cable network in a bi-directional manner.

BACKGROUND

Cable Television (CATV) networks have been undergoing rapid upgrading, particularly in North America, in order to provide advanced services, such as digital video, telephony and Internet services. A major part of the upgrade cycle has been the development of the return path network—the path from residential subscribers to the CATV Headend. Previously, this portion of the network was used little, generally only for minor maintenance and billing operations. As interactivity needs grew and CATV technology advanced, this portion of the network became more significant. Now, the return path forms a critical portion of the system for two-way interactivity, such as telephony and data traffic.

The performance of digital return links can be compared favorably to their analog counterparts. Traditionally, the performance is flexibly traded off against bandwidth by simply truncating the Analog-to-Digital (A/D) word size to the desired amount of resolution. Smaller parallel word sizes translate to less serial bits-per-second to transmit, and thus lower line rates and lower required transmission bandwidths. Lower performance occurs by noting that the number of A/D converter bits sets the signal-to-noise ratio (SNR) for the signal being transported. When the signal is uniformly quantized, the classic relationship is 6 decibels (dB) per bit, meaning more bits translate into a higher SNR.

Because of the trade-off between performance and word size—and thus line signaling rate and transmission bandwidth—it is advantageous to find ways to improve the SNR from A/D conversion, but using lower resolution conversions.

The present invention is therefore directed to the problem of developing a method and apparatus for improving the SNR from an analog-to-digital conversion while using fewer bits of resolution. This SNR improvement can also be realized as an improvement in noise power ratio (NPR).

SUMMARY OF THE INVENTION

The present invention solves these and other problems by providing a method and apparatus for performing a digital companding technique that reduces the number of bits while also satisfying performance requirements that are typical of a high-resolution system.

According to one aspect of the present invention, an exemplary embodiment of a method for performing a digital companding adds a predetermined offset to the digital value to be companded, and employs a modification of traditional μ-law or a-law companding techniques to obtain a reduced bit length digital value. The end result is that the performance metrics are not significantly affected by this bit reduction when compared to current higher resolution transmission methods without this technique.

According to one aspect of the present invention, an exemplary embodiment of the modified companding technique employs a shortened chord and an elongated step size. In a 12-bit implementation, the chord size is reduced to two bits while the step size is increased to five bits.

BRIEF DESCRIPTION OF THE DRAWINGS

FIG. 7 shows an exemplary embodiment of an apparatus for communicating over a fiber link according to yet another aspect of the present invention.

DETAILED DESCRIPTION

It is worthy to note that any reference herein to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
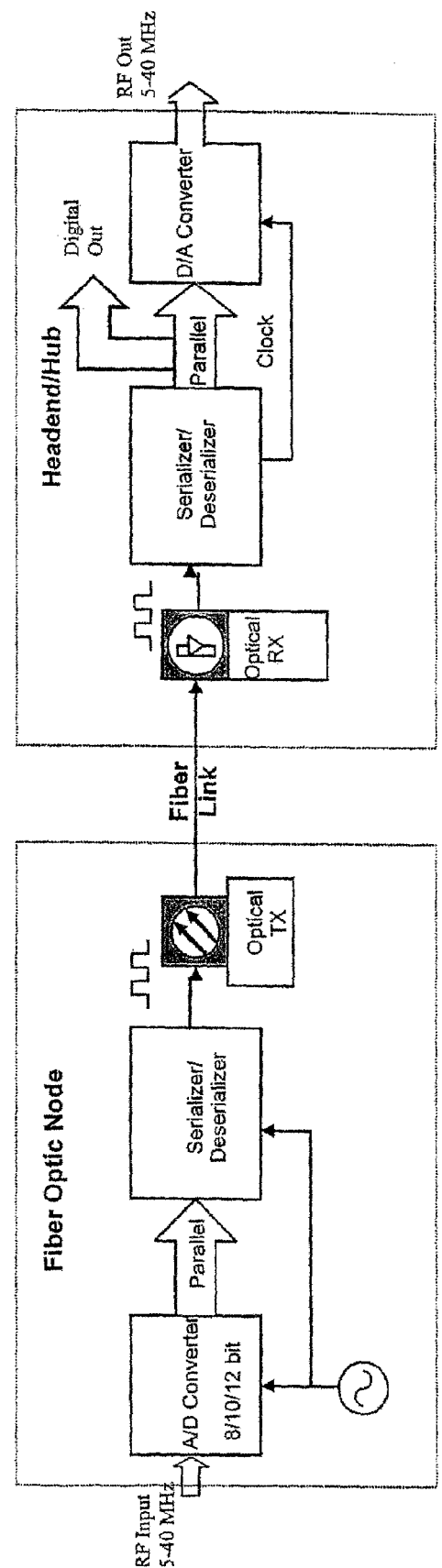
FIG. 1 shows a conventional cable television return path communications system.

U.S. Pat. No. 6,323,793 discloses an enhanced approach to return path design and presents a way to architect the return path portion of the system. This patent is hereby incorporated by reference as if repeated herein in its entirety, including the drawings. FIG. 1 shows a block diagram of such a system. The use of this digital optical technology provides many key advantages compared to traditional analog systems. Among these are longer network distances, performance insensitivity to distance, environmental robustness, cost advantages, and standards-based interfaces. In addition, digital return path systems provide the flexibility necessary for the introduction of further advances in technology.

In these digital return path systems, if signal processing can increase the SNR or NPR, a lower number of bits of transport can be used to meet a given SNR compared to the basic digital return system in FIG. 1. An example of such an approach for return systems is through the use of companding/expanding, which will be described below.

While it is straightforward to obtain a reasonable SNR at the receive end with off-the-shelf A/D technology available today, HFC architecture design involves more complexity than this basic single point-to-point example. In practical hub and Headend environments, received inputs from topologically diverse nodes are often combined (e.g., RF summed). Each such combine entails a noise penalty of 3 dB, or effectively decreases the resolution of the digital return system by one-half of a bit. In essence, such a system designed with a 10-bit A/D converter in the field, and combined four ways at the Headend, has the theoretical performance of an 8-bit system. Similarly, if the end-of-line performance must have ten bits of resolution after a four-way combine, then the conversion process must begin with 12-bits of theoretical performance at each node. However, this entails an increase in line rate and device technology not easily achievable, or is simply more costly. Thus, there is strong motivation to reduce the word size while maintaining high performance A/D systems.

In addition to link performance advantages, there is significant bandwidth savings from the network architecture perspective if bit reduction can be achieved. As noted, simple point-to-point architectures are augmented with more network complexity in real cable systems. Thus, a further benefit of this implementation is to allow for the bandwidth savings to accumulate in TDM-based digital return systems. For example, under the assumption that an 8-bit system can be processed to deliver 10-bit like Noise Power Ratio (NPR) performance, significant line rate savings can be achieved. In a 4×TDM system, four 10-bit A/Ds are required, each clocked at about 100 Megabits per second (Mbps). The net line rate then becomes (4×10×100 Megahertz (MHz)) bits per second, which equals 4 Gigabits per second (Gbps). However, implementation of the companding system, which saves two bits per sample, achieves savings of 20%. The resulting line rate becomes (4×8×100 MHz) or 3.2 Gbps. Significantly, this rate is within range of compatibility of standard electrical and optical devices with minor adjustments to clock frequency. Thus, saving two bits per sample can translate to a significant bandwidth savings.

Companding

The theory of quantizing is well understood. One of the key concepts of quantization noise theory is that the input signal amplitude does not affect the root-mean-square (rms) level of quantization noise. Because of this, the SNR at the A/D converter output is a direct function of the input amplitude. It is for this reason that level control in front of an A/D converter is often employed, assuring the best SNR possible is obtained. However, the dynamics of cable return path signal multiplexes creates dynamic range issues not easily resolved with gain control circuits due to both the range of adjustment and response times required to do so. Because of this, the average signal power must be reduced to prevent overdrive. A consequence is a lower SNR. An alternative method to achieve a better average SNR is to fundamentally change the structure of the quantization process, making it non-uniform.

Figure 2:
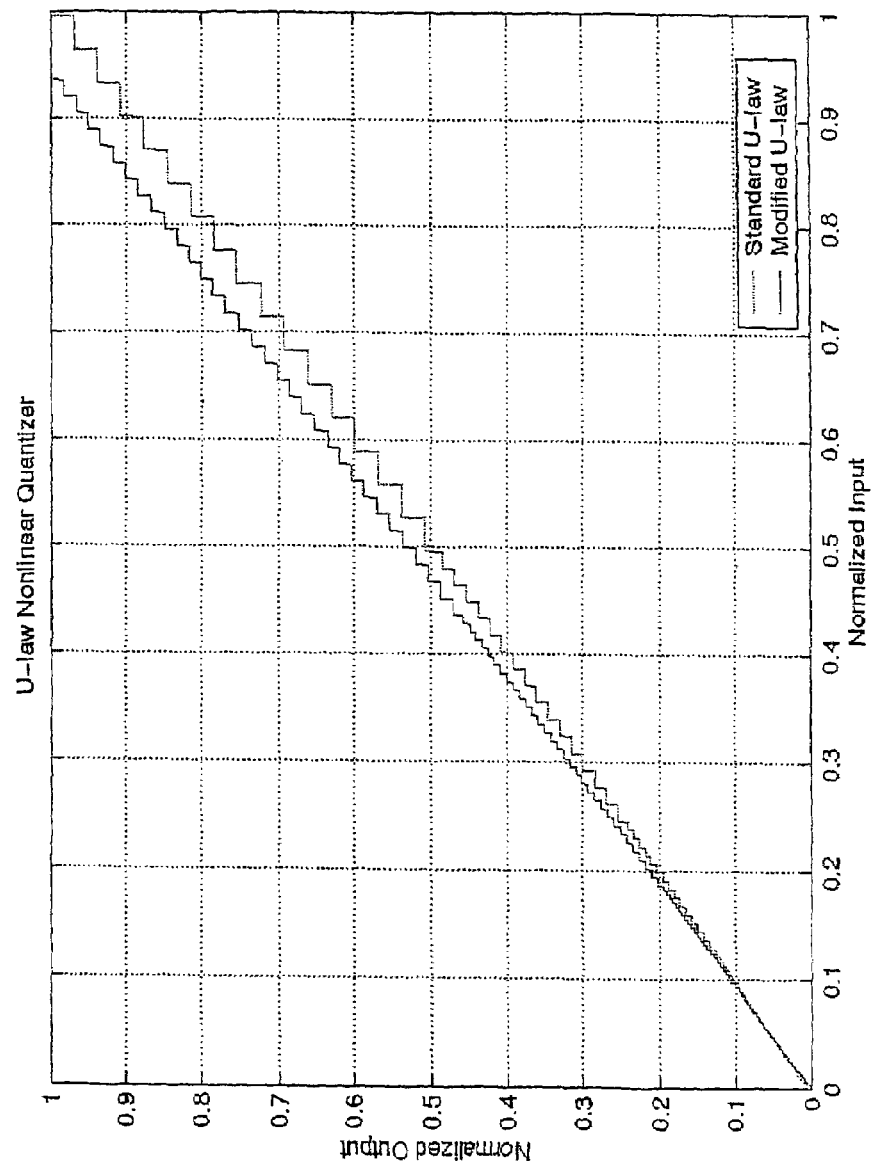
FIG. 2 shows non-uniform quantization for both standard u-law and a modified u-law step according to one aspect of the present invention.

Non-uniform quantization involves implementation of circuits or algorithms that allow smaller amplitude signals—those that will suffer low SNR because of the above mentioned property in uniform quantization—to be resolved with higher resolution. More quantization steps are provided at the low end of the scale relative to the high amplitude end of the scale. FIG. 2 shows encoding steps based on a non-uniform quantization approach.

In principle, companding of the signal can be performed through analog distortion of the waveform, compressing large amplitude values and enhancing weak amplitude values, driving a uniformly quantizing A/D, such that the output A/D converter has higher SNR. At the opposite end of the system, the reciprocal function must be performed to maintain fidelity. However, such analog circuits are difficult to implement with ideal cancellation of the distortion, particularly in harsh environments, such as this particular implementation, and results in added parts. In addition, deliberate analog distortion causes other unwanted analog spectral issues. Thus, a digital companding approach is undertaken.

Digital Companding

The advantage of digital companding is that the transmission bandwidth of the signal is not changed, since this bandwidth is still dependent only upon the rate of samples per second and the pulse shape, and not on the content that the bits represent. This is in contrast to analog compression-expansion, where implementation of a non-linearity on the waveform affects the spectral spread of the signal, and thus the required transmission bandwidth. Other key advantages include taking advantage of already existing digital components available for this purpose (e.g., Field Programmable Gate Arrays, or FPGA's), and exact repeatability/cancellation of the compression and expansion function. Such devices are already part of the traditional system implementation. Typical use of companding and expanding has been implemented via digital signal processing (DSP) chips (i.e., software implementations), which is a solution that is well suited to voice applications because of the low rate conversions and slower speeds of DSP-based solutions. In this application, such slow processing speeds are not a viable alternative.

Modified μ-Law/a-Law Compander

Figure 3:
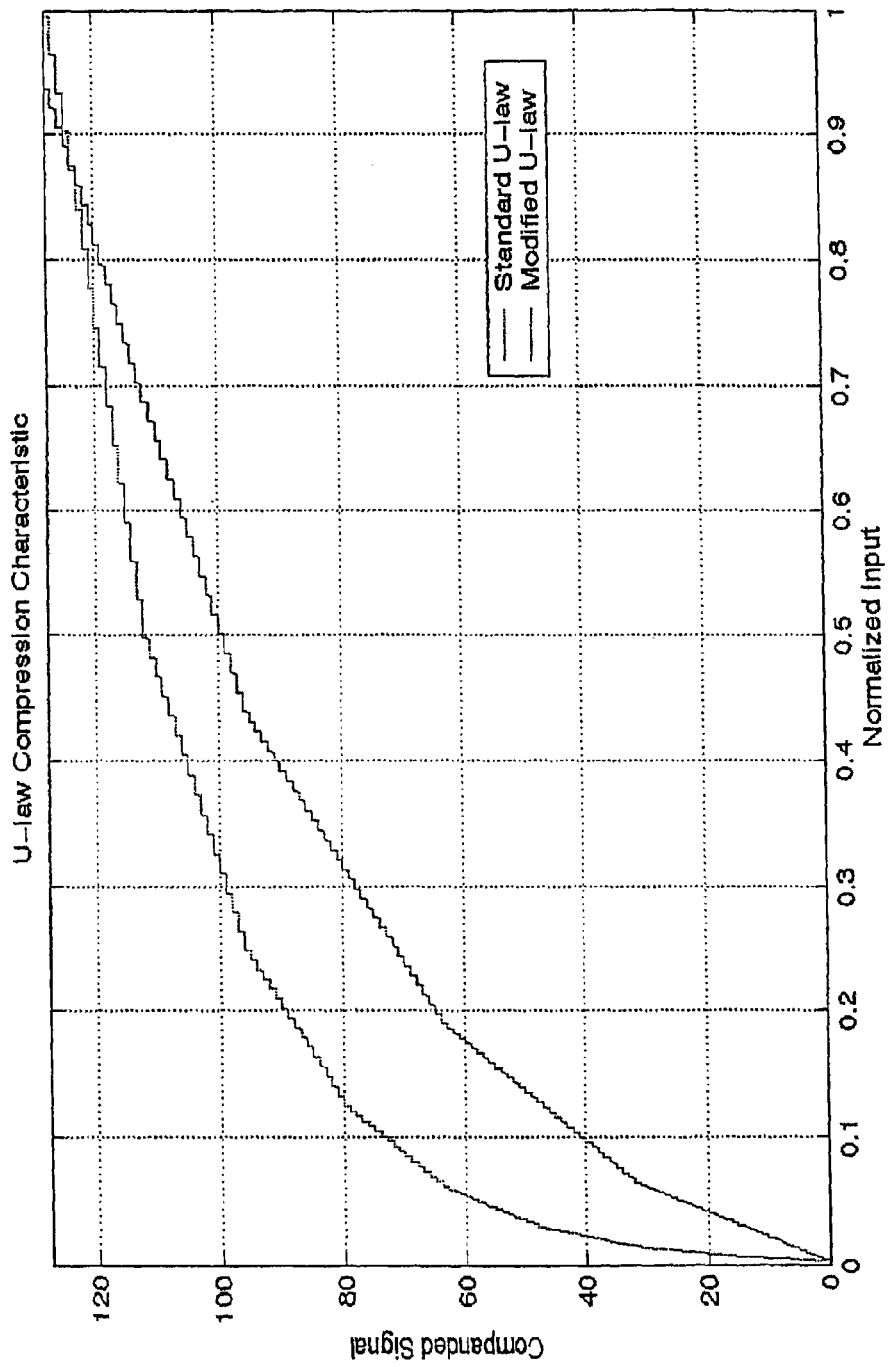
FIG. 3 shows a compression characteristic for both a standard and modified u-law according to one aspect of the present invention.

Standard μ-law/a-law companding is well defined by telecommunication standards. FIG. 3 shows a plot of a standard μ-law characteristic. These methods, traditionally used in voice applications, can be used directly in a CATV digital return transmitter and receiver. It allows four bits of data reduction (converts a 12-bit A/D output to an 8-bit word) with reasonable NPR results. However, raw implementation results in performance shortcomings that generally fall below requirements necessary in CATV return systems. Specifically, the peak NPR is lower than a commonly recognized minimum specification of 40 dB. In order to overcome this problem, the present invention provides an application-specific algorithm using a modification to traditional μ-law/a-law methods for the purpose of creating a compression approach that is well suited to CATV systems.

The discussion will be based on μ-law companding. This solution turns out to be the better one from a performance standpoint for a CATV return path system. The mathematical expression for μ-law compression is given by:

$$y = \mathrm{sgn}(m)[\ln(1+\mu|m/m_p|)/\ln(1+\mu)]$$

where sgn(x) is the "sign" function (−1 m 1)

ln(x) is the natural logarithm (log to the base e)

μ is the compression parameter, a variable that defines the input/output characteristic m is the input voltage value $m_p$ is the peak voltage, the maximum quantization level for an A/D converter.

Clearly, this kind of detailed mathematical structure would be difficult to implement with precision in an analog circuit, whereby a software implementation could realize any desired expression with precision as a design parameter. A digital implementation, as disclosed herein, that uses a look-up table, can provide a good, repeatable approximation. A digital implementation is based on a piece-wise linear approximation.

The expansion equation that returns the signal to its original form (item 78, FIG. 7) is given by:

$$f'(y) = \mathrm{sgn}(y)(1/\mu)[(1+\mu)^{|y|}-1]$$

Implemented digitally, the μ-law function is performed by reading the input word from the A/D, and implementing the below translation in a look-up table. Table 1 and Table 2 show μ-law encoding and decoding for a digital implementation.

TABLE 1

μ-Law Digital Encoding

| Biased Input Value | | | | | | | | | | | | | | Compressed Code Word | | | | | | | | |
| --- | --- | --- | --- | --- | --- | --- | --- | --- | --- | --- | --- | --- | --- | --- | --- | --- | --- | --- | --- | --- | --- | --- |
| | | | | | | | | | | | | | | | Chord | | | | Step | | | |
| Bit: | 12 | 11 | 10 | 9 | 8 | 7 | 6 | 5 | 4 | 3 | 2 | 1 | 0 | Bit: | 6 | 5 | 4 | 3 | 2 | 1 | 0 |
| | 0 | 0 | 0 | 0 | 0 | 0 | 0 | 1 | a | b | c | d | x | | 0 | 0 | 0 | a | b | c | d |
| | 0 | 0 | 0 | 0 | 0 | 0 | 1 | a | b | c | d | x | x | | 0 | 0 | 1 | a | b | c | d |
| | 0 | 0 | 0 | 0 | 0 | 1 | a | b | c | d | x | x | x | | 0 | 1 | 0 | a | b | c | d |
| | 0 | 0 | 0 | 0 | 1 | a | b | c | d | x | x | x | x | | 0 | 1 | 1 | a | b | c | d |
| | 0 | 0 | 0 | 1 | a | b | c | d | x | x | x | x | x | | 1 | 0 | 0 | a | b | c | d |
| | 0 | 0 | 1 | a | b | c | d | x | x | x | x | x | x | | 1 | 0 | 1 | a | b | c | d |
| | 0 | 1 | a | b | c | d | x | x | x | x | x | x | x | | 1 | 1 | 0 | a | b | c | d |
| | 1 | a | b | c | d | x | x | x | x | x | x | x | x | | 1 | 1 | 1 | a | b | c | d |

TABLE 2

μ-Law Digital Decoding

| Compressed Code Word | | | | | | | | Biased Output Value | | | | | | | | | | | | | |
| --- | --- | --- | --- | --- | --- | --- | --- | --- | --- | --- | --- | --- | --- | --- | --- | --- | --- | --- | --- | --- | --- |
| Chord | | | Step | | | | | | | | | | | | | | | | | | |
| Bit: | 6 | 5 | 4 | 3 | 2 | 1 | 0 | Bit | 13 | 11 | 10 | 9 | 8 | 7 | 6 | 5 | 4 | 3 | 2 | 1 | 0 |
| | 0 | 0 | 0 | a | b | c | d | | 0 | 0 | 0 | 0 | 0 | 0 | 0 | 1 | a | b | c | d | 1 |
| | 0 | 0 | 1 | a | b | c | d | | 0 | 0 | 0 | 0 | 0 | 0 | 1 | a | b | c | d | 1 | 0 |
| | 0 | 1 | 0 | a | b | c | d | | 0 | 0 | 0 | 0 | 0 | 1 | a | b | c | d | 1 | 0 | 0 |
| | 0 | 1 | 1 | a | b | c | d | | 0 | 0 | 0 | 0 | 1 | a | b | c | d | 1 | 0 | 0 | 0 |
| | 1 | 0 | 0 | a | b | c | d | | 0 | 0 | 0 | 1 | a | b | c | d | 1 | 0 | 0 | 0 | 0 |
| | 1 | 0 | 1 | a | b | c | d | | 0 | 0 | 1 | a | b | c | d | 1 | 0 | 0 | 0 | 0 | 0 |
| | 1 | 1 | 0 | a | b | c | d | | 0 | 1 | a | b | c | d | 1 | 0 | 0 | 0 | 0 | 0 | 0 |
| | 1 | 1 | 1 | a | b | c | d | | 1 | a | b | c | d | 1 | 0 | 0 | 0 | 0 | 0 | 0 | 0 |

12-Bit to 8-Bit Modified μ-Law Compander

In this modified implementation, the sign bit of original data is transferred directly to the Most Significant Bit (MSB) of the 8-bit output. The 11 bits magnitude is added by an offset of 129 then converted to 7 bits of data. Table 3 indicates the binary encoding and Table 4 illustrates the binary decoding. The goal of the modification was to expand the noise power ratio (NPR) dynamic range, and an explanation of these differences is described in the section describing the evaluation of the performance comparison.

TABLE 3

Modified μ-Law Digital Encoding

| Biased Input | | | | | | | | | | | Compressed Code Word | | | | | | |
| --- | --- | --- | --- | --- | --- | --- | --- | --- | --- | --- | --- | --- | --- | --- | --- | --- | --- |
| | | | | | | | | | | | Chord | | Step | | | | |
| Bit: | 10 | 9 | 8 | 7 | 6 | 5 | 4 | 3 | 2 | 1 | 0 | 6 | 5 | 4 | 3 | 2 | 1 | 0 |
| | 0 | 0 | 0 | 1 | A | B | C | D | E | x | x | 0 | 0 | A | B | C | D | E |
| | 0 | 0 | 1 | A | B | C | D | E | x | x | x | 0 | 1 | A | B | C | D | E |
| | 0 | 1 | A | B | C | D | E | x | x | x | x | 1 | 0 | A | B | C | D | E |
| | 1 | A | B | C | D | E | x | x | x | x | x | 1 | 1 | A | B | C | D | E |

TABLE 4

Modified μ-Law Digital Decoding

| Compressed Code Word | | | | | | | | Biased Output | | | | | | | | | | |
| --- | --- | --- | --- | --- | --- | --- | --- | --- | --- | --- | --- | --- | --- | --- | --- | --- | --- | --- |
| Chord | | Step | | | | | | | | | | | | | | | | |
| Bit: | 6 | 5 | 4 | 3 | 2 | 1 | 0 | 10 | 9 | 8 | 7 | 6 | 5 | 4 | 3 | 2 | 1 | 0 |
| | 0 | 0 | A | B | C | D | E | 0 | 0 | 0 | 1 | A | B | C | D | E | 1 | 0 |
| | 0 | 1 | A | B | C | D | E | 0 | 0 | 1 | A | B | C | D | E | 1 | 0 | 0 |
| | 1 | 0 | A | B | C | D | E | 0 | 1 | A | B | C | D | E | 1 | 0 | 0 | 0 |
| | 1 | 1 | A | B | C | D | E | 1 | A | B | C | D | E | 1 | 0 | 0 | 0 | 0 |

The table can be understood by recognizing the following:
1. Biased Input=Original Input value+129
2. Final Output=Biased Output Value−129.
3. "x" presents the discarded bits in the encoding process.
4. ABCDE represent "don't' care" bits of the original code word.
5. Compressed Code Word={sign, chord[1:0], step [4:0]}.

12-Bit Modified a-Law Compander

A-law compander (not added offset is) binary encoding and decoding are shown in Table 5 and Table 6, respectively.

TABLE 5

Modified a-Law Digital Encoding

| | | | Original Input | | | | | | | | Compressed Code Word | | | | | |
| --- | --- | --- | --- | --- | --- | --- | --- | --- | --- | --- | --- | --- | --- | --- | --- | --- |
| | | | | | | | | | | | | Chord | | Step | | |
| Bit: | 10 | 9 | 8 | 7 | 6 | 5 | 4 | 3 | 2 | 1 | 0 | 6 5 | 4 | 3 | 2 | 1 | 0 |
| | 0 | 0 | 0 | A | B | C | D | E | x | x | x | 0 0 | A | B | C | D | E |
| | 0 | 0 | 1 | A | B | C | D | E | x | x | x | 0 1 | A | B | C | D | E |
| | 0 | 1 | A | B | C | D | E | x | x | x | x | 1 0 | A | B | C | D | E |
| | 1 | A | B | C | D | E | x | x | x | x | x | 1 1 | A | B | C | D | E |

TABLE 6

Modified a-Law Digital Decoding

| Compressed Code Word | | | | | | | | Decoder Output | | | | | | | | |
| --- | --- | --- | --- | --- | --- | --- | --- | --- | --- | --- | --- | --- | --- | --- | --- | --- |
| Chord | | Step | | | | | | | | | | | | | | |
| Bit: 6 | 5 | 4 | 3 | 2 | 1 | 0 | 10 | 9 | 8 | 7 | 6 | 5 | 4 | 3 | 2 | 1 | 0 |
| 0 | 0 | A | B | C | D | E | 0 | 0 | 0 | A | B | C | D | E | 1 | 0 | 0 |
| 0 | 1 | A | B | C | D | E | 0 | 0 | 1 | A | B | C | D | E | 1 | 0 | 0 |
| 1 | 0 | A | B | C | D | E | 0 | 1 | A | B | C | D | E | 1 | 0 | 0 | 0 |
| 1 | 1 | A | B | C | D | E | 1 | A | B | C | D | E | 1 | 0 | 0 | 0 | 0 |

Note:
1. "x" represents the discarded bits in the encoding process.
2. ABCDE represent "don't care" bits of the original code word.
3. Compressed Code Word = {sign, chord[1:0], step[4:0]}.

Performance Testing

Figure 4:
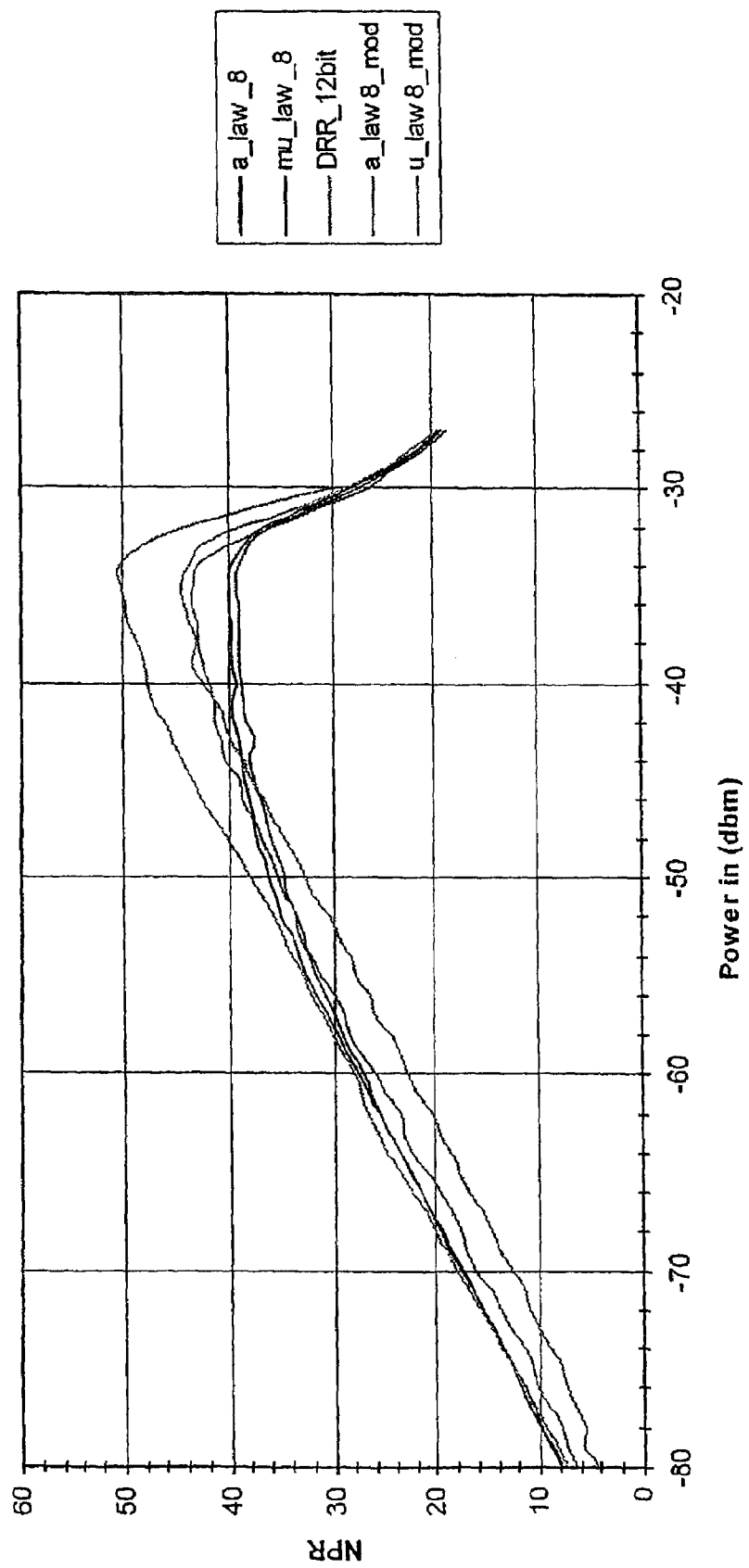
FIG. 4 shows reduced bandwidth noise power ratio performance, compared to unreduced.

Noise power ratio testing on the companding schemes reveals performance changes that are important to cable operators, and that can be attributed to various algorithms. The above encoding/decoding methods are implemented in a digital return transmitter (DRT) and digital return receiver (DRR) platform that is based on FIG. 7. The NPR test results are shown in FIG. 4.

Please refer to the following nomenclature used in the plot of the results:
1. "a_law_8" is a standard a-law compander.
2. "μ_Law_8" is standard μ-Law compander.
3. "DRR_12" is original 12-bit data without a compander.
4. "a_law8_mod" is a modified a-law compander.
5. "μ_Law8_mod" is a modified μ-Law compander.

The test results indicate that the modified μ-Law/a-law companders improve the peak NPR performance by 3-5 dB compared with standard companders. There is a trade-off, in that the NPR for lower amplitude input values is degraded by 2-6 dB. However, the higher degradation values are associated with the a-law version, thus indicating the adherence to a modified μ-Law companding scheme is the appropriate choice for a return path cable network. As can be seen, the modified μ-Law compander provides higher performance than the a-law compander. An important property of either modification is that by adjusting the encoding/decoding mechanism by exchanging bits between chord and step, the NPR curve can be shaped by design, resulting in the ability to optimize by application.

Figure 5:
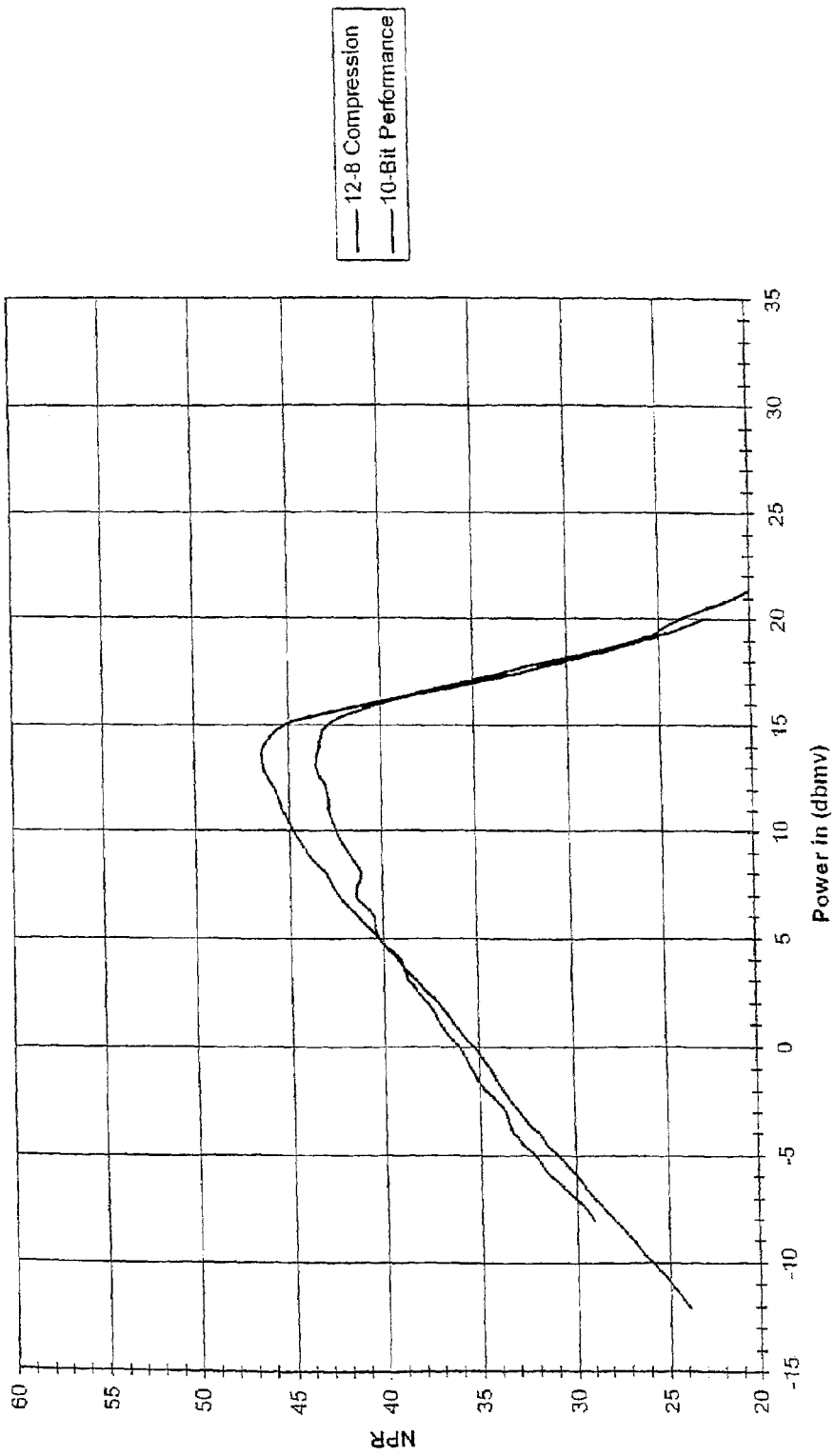
FIG. 5 shows a reduced bandwidth performance according to another aspect of the present invention, compared to existing implementations without reduced bandwidth

In FIG. 5, the performance of 12-bit to 8-bit μ-Law compression is compared against existing state-of-the-art 10-bit, unprocessed performance. While it is clear that the peak NPR is degraded, which is an unavoidable effect of such processing, it is apparent that providing resolution that varies logarithmically with input level offers the same dynamic range performance, about 11-12 dB above the NPR=40 dB threshold. It is this parameter that is of most interest for CATV return paths. NPR dynamic range defines the robustness of a link by providing the operational range over which a performance guarantee can be made. Thus, the compressed system yields performance equivalent on this key metric, while saving bandwidth, compared to the unprocessed system.

Evaluation of Performance Comparison

The difference between a modified compander and a standard compander is the implementation of the two "sets" of bits used for digital a-law/μ-law companding. The "chord" is the portion of the word that is associated with a compression operation. This set of bits identifies a "region" of the voltage range, within which uniform "steps" resolve the input to the closest quantization level, constrained by the size of a chord, and how many bits are allocated to a step. The more bits that are used for chord determination, the larger the dynamic range that can be allocated. However, there are a fixed number of bits to work with, and the trade-off that must be considered is that if more bits are assigned to the chord, then less are available for the resolution with the chord. If the chord bits are exchanged for more step bits, then more accurate conversion can be preserved with a smaller dynamic range.

In the standard μ-law compander, three bits are used for the chord (also called exponent) and four bits are for the step (also called mantissa). This, however, is optimized for a 14-bit to 8-bit conversion. In CATV, where speed limitations provide only 12-bit conversion capability, a 12-bit to 8-bit conversion is realized instead, and the 3-bit exponent has not been fully utilized. Based on this factor, the modified μ-law compander instead uses a 2-bit exponent, allowing a 5-bit mantissa, improving the resolution of the steps. In order to accommodate the dynamic range, an offset of 129 is added to the original data. The result of the modification is improvement of the accuracy of the large magnitude conversion, and some previously mentioned loss in dynamic range associated with the degraded SNR for low input values. Again, however, the goal was to achieve a wider dynamic range capability above a 40 dB NPR, which has been shown to be achieved, allowing a previously unattainable NPR value to now be exceeded by about 10-12 dB.

Method for Performing Companding/De-Companding

Figure 6:
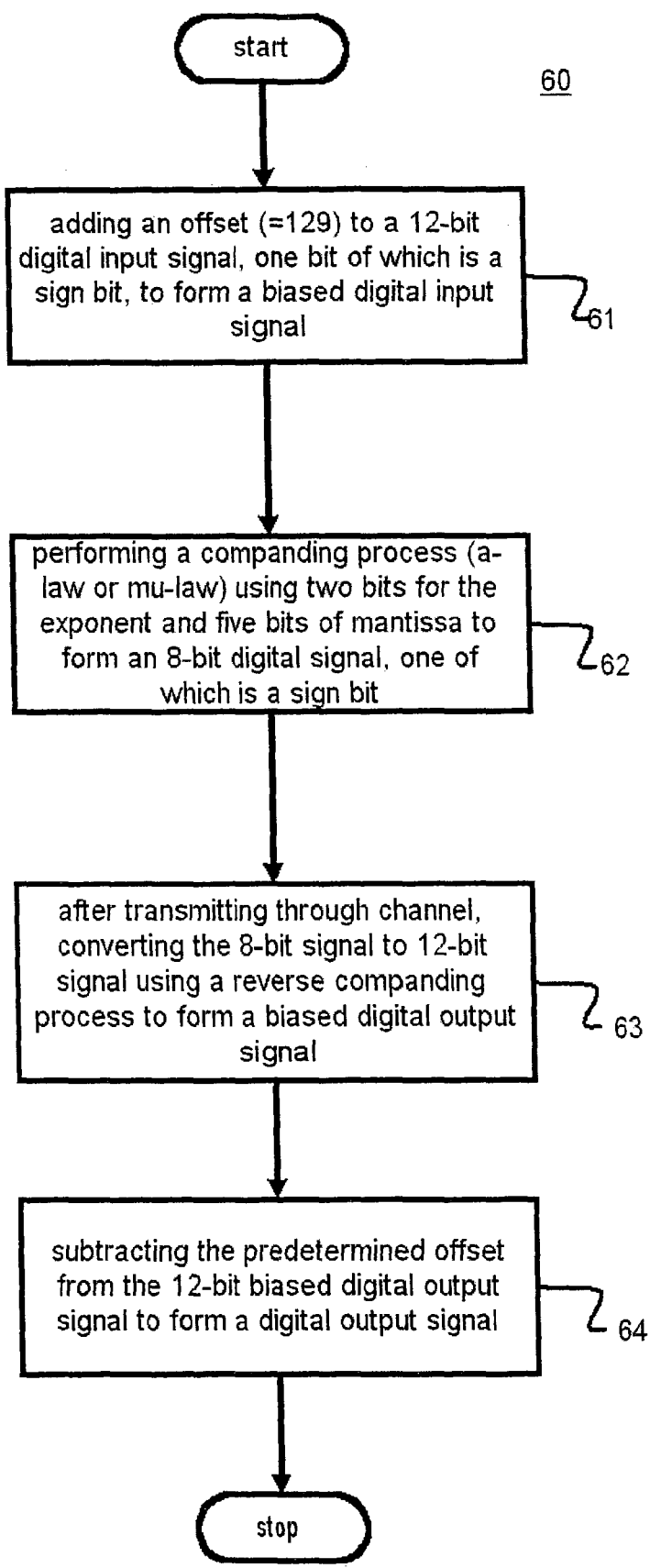
FIG. 6 shows an exemplary embodiment of a method for performing a digital companding according to another aspect of the present invention.

Turning to FIG. 6, shown therein is a method for performing a companding and de-companding (or expansion) process according to yet another aspect of the present invention. The process 60 begins by adding an offset (e.g., 129) to a 12-bit digital input signal, for example, one bit of which is a sign bit, to form a biased digital input signal (element 61). Next, the process performs a companding process (a-law or μ-law) using two bits for the exponent and five bits of mantissa to form an 8-bit digital signal, one of which is a sign bit (element 62). After transmitting the reduced bit length value through a communications channel or other process (e.g., writing to memory), the de-companding (or expansion) process converts the 8-bit signal to 12-bit signal using a reverse companding process to form a biased digital output signal (element 63). As this biased digital output signal includes the predetermined offset, the de-companding process subtracts the predetermined offset from the 12-bit biased digital output signal to form a digital output signal (element 64). As this digital output signal has lost some bits in the companding/de-companding process, the output is merely an approximation of the original digital signal, albeit a very good one as a result of inter the present invention.

Apparatus for Communicating Via HFC Return Path

Turning to FIG. 7, shown therein is an apparatus 70 for communicating over a communications channel, such as an HFC return path, or other similar process, according to still another aspect of the present invention. In this case, the apparatus is transmitting/receiving a 5-40 MHz RF signal. At the input side, the apparatus 70 passes the incoming RF signal through an A/D converter 71, which converts the input to a 12-bit data stream. A companding processor 72 in conjunction with a memory 73 that stores a look-up table with a mapping from 12-bits to 8-bits converts the 12-bit data stream to an 8-bit data stream. A serializer/deserializer 74 receives the 8-bit stream (and the clock from the A/D converter 71) and passes its output to an optical transmitter 75, which is coupled to the communications channel—in this case a fiber link. At the receiving end, an optical receiver 76 outputs an 8-bit digital data stream to the serializer/deserializer 77, which in turn outputs the 8-bit data stream to a de-companding processor 78. Working with a memory 79 storing a look-up table with a mapping from an 8-bit word to a 12-bit word, the de-companding processor 78 converts the incoming 8-bit data stream to a 12-bit data stream and outputs the result to a digital-to-analog converter 81, which recreates the original analog input. A digital output is also provided, if necessary or desired. Of course, the serializer/deserializer passes the clock to the digital-to-analog converter 81. An FPGA could be used as the transmission side processor 72 and the memory 73 as well as the receiver side processor 78 and memory 79.

Conclusion

Digital return systems are becoming more prevalent in CATV return systems because of the many advantages they offer in terms of performance, cost and flexibility. The result is that new techniques can be deployed in the return path that previously were not available. This description provides one such example, showing how digital link performance can be enhanced with digital signal processing techniques to provide an improved NPR over a digital return system employing the same resolution of A/D conversion. The advantage of this technique, as described herein, is to make a system with constrained number of bits of resolution or, by implication, a constrained serial line rate, have the performance of a system with higher resolution and line rate. In the example given herein, an 8-bit transport system, which is a convenient hardware implementation, offers the performance in NPR dynamic range of a 10-bit system. Finally, a further benefit of this implementation is to allow for the bandwidth savings to accumulate in TDM-based digital return systems. The companding system described above offers a line rate reduction of 20%, which can significantly impact ease of hardware implementation.

Although various embodiments are specifically illustrated and described herein, it will be appreciated that modifications and variations of the invention are covered by the above teachings and are within the purview of the appended claims without departing from the spirit and intended scope of the invention. For example, the present invention has been described in relation to cable television systems, however, the same technique could be applied to other systems requiring analog-to-digital conversions. Furthermore, this example should not be interpreted to limit the modifications and variations of the inventions covered by the claims but is merely illustrative of one possible variation.

What is claimed is:

1. A method for companding a digital signal comprising:
adding an offset to the digital signal to form a biased digital signal; and
converting the biased digital signal to a shortened digital signal,
wherein the digital signal comprises one sign bit and eleven bits of magnitude the offset comprises a value of 129.

2. The method according to claim 1, wherein the converting comprises a μ-law companding process.

3. The method according to claim 1, wherein the converting comprises an a-law companding process.

4. A method for converting a 12-bit digital signal to a 7-bit digital signal comprising:
using a two-bit exponent and a 5-bit mantissa to represent the 12-bit digital signal when performing a companding process to seven bits; and
adding a predetermined offset to the digital signal before performing the companding process.

5. The method according to claim 4, wherein the predetermined offset comprises a value of 129.

6. The method according to claim 4, wherein the companding process comprises a μ-law companding process.

7. The method according to claim 4, wherein the companding process comprises an a-law companding process.

8. A method for companding a digital input signal comprising:
adding a predetermined offset to the digital signal to obtain a biased input signal;

converting the biased input signal to a biased output signal by a companding process; and subtracting the predetermined offset from the biased output signal to obtain a final digital output signal, wherein the digital input signal comprises twelve bits, one of which includes a sign bit, and the sign bit is transferred to the final digital output signal.

9. A method for companding a digital input signal comprising:

adding a predetermined offset to the digital signal to obtain a biased input signal;

converting the biased input signal to a biased output signal by a companding process; and subtracting the predetermined offset from the biased output signal to obtain a final digital output signal, wherein the digital input signal comprises twelve bits, one of which includes a sign bit, and the predetermined offset comprises a value of 129.

10. The method according to claim 8, wherein the companding process comprises a μ-law companding process.

11. A method for companding a digital input signal comprising:

adding a predetermined offset to the digital signal to obtain a biased input signal;

converting the biased input signal to a biased output signal by a companding process; and subtracting the predetermined offset from the biased output signal to obtain a final digital output signal, wherein the final digital output signal comprises eight bits, one of which includes a sign bit.

12. An apparatus for performing a companding process on a digital signal comprising:

a transmission processor receiving the digital signal and adding a predetermined offset to the digital signal to obtain a biased input signal;

a memory coupled to the transmission processor and storing a first lookup table with a mapping of a companding process from a first value to a second value, wherein the first value has more bits than the second value, said transmission processor using the biased input signal to obtain a converted value in the first lookup table corresponding the biased input signal having fewer bits than the biased input signal and outputting the converted value for transmission over a communications channel.

13. The apparatus according to claim 12, further comprising:

a receiver processor receiving the converted value from the communications channel; and a memory coupled to the receiver processor and storing a second lookup table with a mapping of the companding process from a third value to a fourth value, wherein the fourth value has more bits than the third value, said receiver processor using the received converted value to obtain an approximation of the biased input signal in the second lookup table corresponding the received converted value having more bits than the received converted value, subtracting the predetermined value from the approximation of the biased input signal and outputting a result as an approximation of the digital signal received over the communications channel.

14. The apparatus according to claim 12, wherein the digital input signal comprises twelve bits, one of which includes a sign bit.

15. The apparatus according to claim 14, wherein the sign bit is transferred to the final digital output signal.

16. The apparatus according to claim 12, wherein the predetermined offset comprises a value of 129.

17. The apparatus according to claim 12, wherein the companding process comprises a μ-law companding process.

18. The apparatus according to claim 12, wherein the converted value comprises eight bits, one of which includes a sign bit.

* * * * *